United States Patent [19]
Yuh et al.

[11] Patent Number: 5,229,962
[45] Date of Patent: Jul. 20, 1993

[54] BUFFERED NONDESTRUCTIVE-READOUT JOSEPHSON MEMORY CELL WITH THREE GATES

[76] Inventors: Perng-Fei Yuh, 19 Odell Ave., Apt. 9, White Plains, N.Y. 10606; Eric Hanson, R.D. 1, Box 671A, Monroe, N.Y. 10950

[21] Appl. No.: 714,447

[22] Filed: Jun. 13, 1991

[51] Int. Cl.⁵ .................. H01L 39/22; G11C 11/44; H03K 3/38; G06F 7/50
[52] U.S. Cl. .................. 365/162; 257/31; 307/306; 307/307; 364/784; 364/786
[58] Field of Search .......... 257/31; 365/162; 307/306, 307; 364/784, 786; 505/1, 832

[56] References Cited
U.S. PATENT DOCUMENTS 4,330,841  5/1982  Yamada et al. ............ 307/476
4,678,945  7/1987  Sugano et al. ............ 307/307

Primary Examiner—Rolf Hille
Assistant Examiner—Wael Fahmy
Attorney, Agent, or Firm—Ostrolenk, Faber, Gerb & Soffen

[57] ABSTRACT

A buffered nondestructive-readout Josephson memory cell comprises only three gates and is free of the half-select problem associated with Josephson memories, for both write and read operations. The basic memory cell unit comprises a first interferometer gate and an associated inductor defining a memory storage loop and a second interferometer gate that, together with a second inductor, defines a second loop in which a current pulse can be established only when a circulating current exists in the first loop. A third gate, responsive to a sense line and to the current pulse in the second loop, provides a voltage output which changes based upon whether a "1" or a "0" has been stored in the storage loop. For fabricating a bit-accessible memory, the third gate is further connected in closed circuit relationship with a third inductor which is magnetically coupled with the first gate.

29 Claims, 8 Drawing Sheets

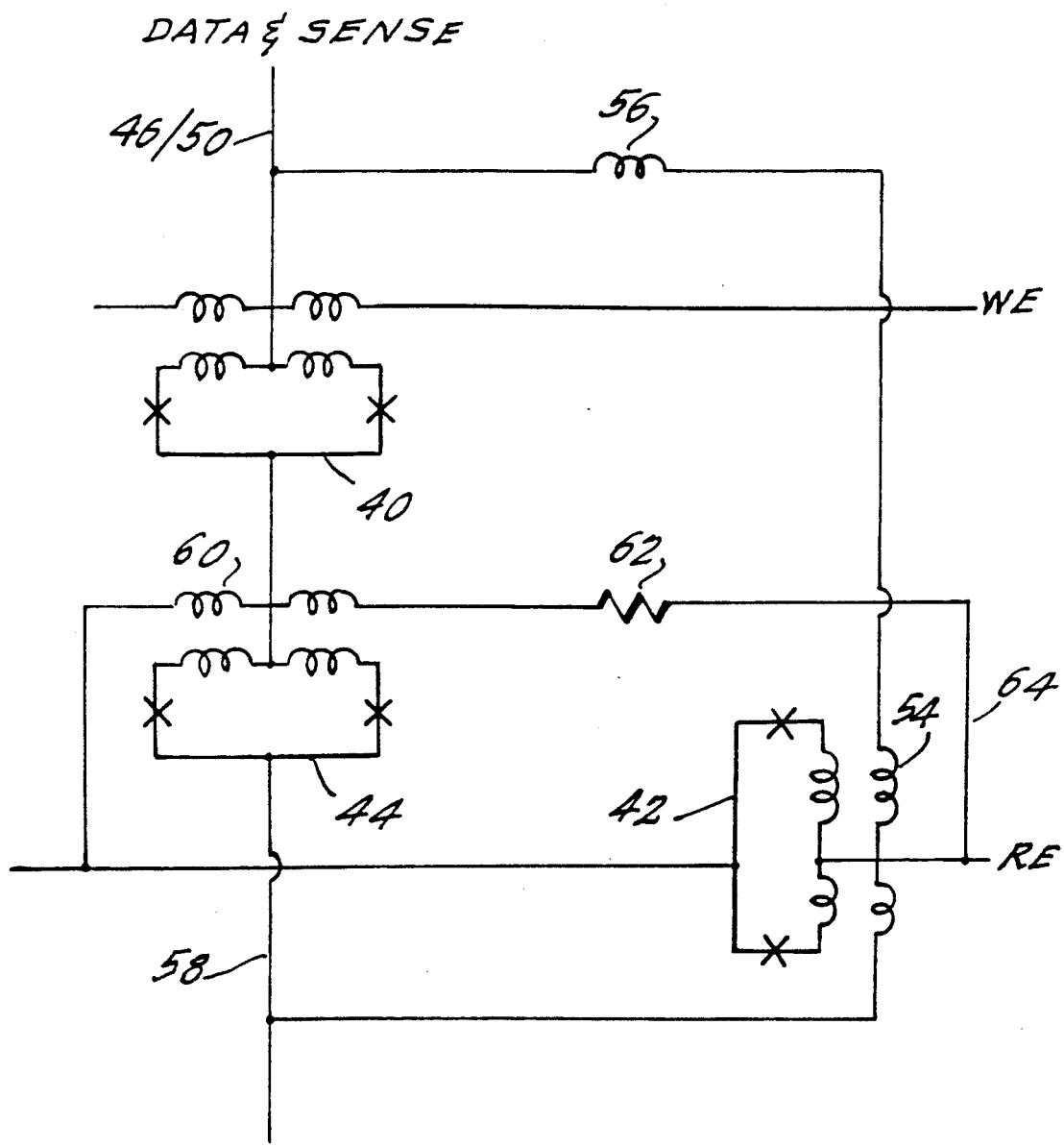

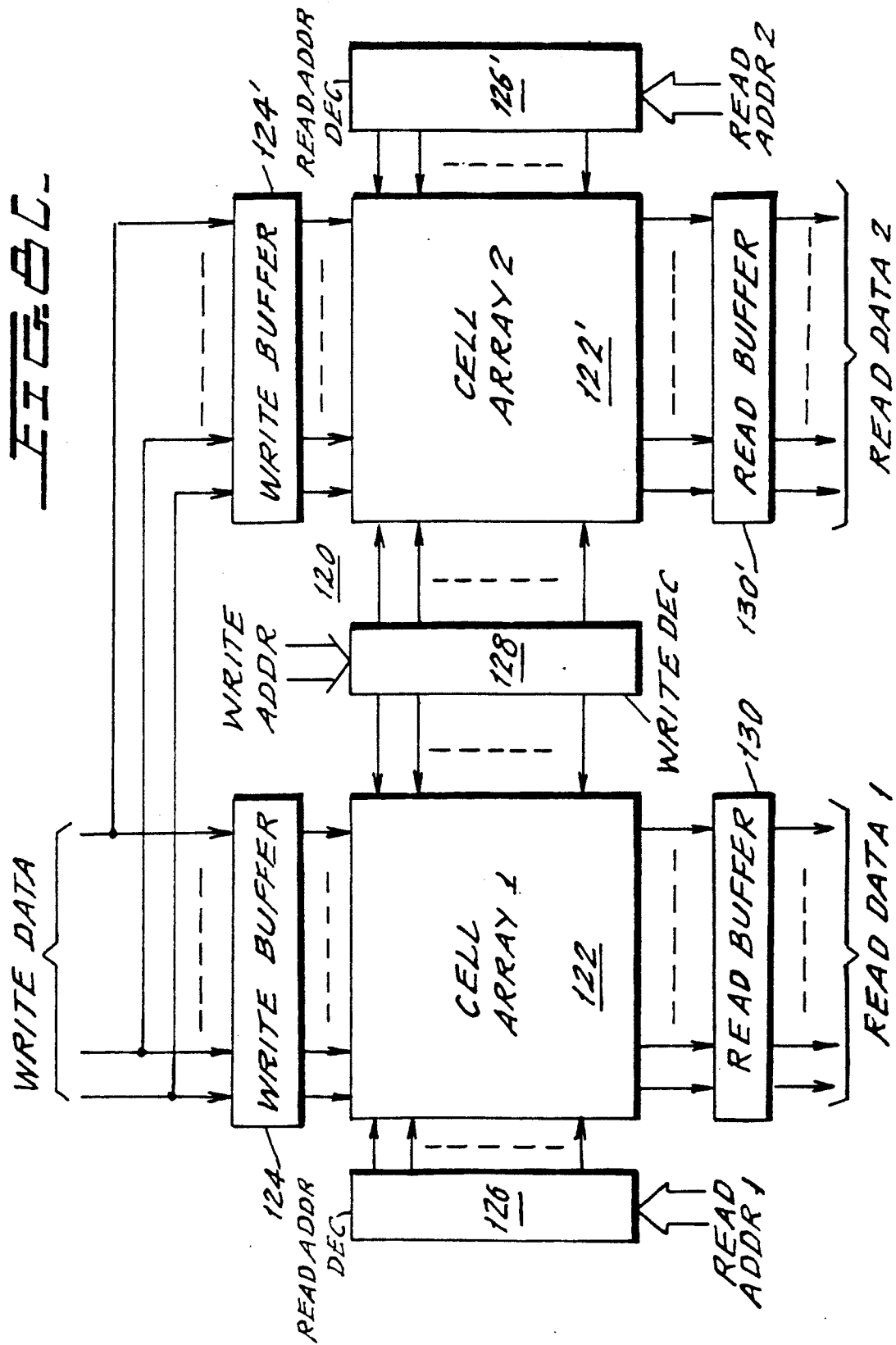

ics, Volume SC-14, pages 794-796, 1979, a nondestructive

BUFFERED NONDESTRUCTIVE-READOUT JOSEPHSON MEMORY CELL WITH THREE GATES

BACKGROUND OF THE INVENTION

The present invention relates to a Josephson memory and, more particularly, to a buffered, nondestructive-readout Josephson memory using a minimal number of gates.

Most of the existing Josephson memories have a "half-select" problem, and their operating margins and hence the yield are low. The half-select problem arises from the fact that a cell in a memory array, organized as a matrix of rows and columns, is selected by coincidentally applying currents in a row and a column. While the selected memory cell senses two units of current, all of the other nonselected cells in that particular row and column still sense one unit of current and thereby become "half-selected". The maximum theoretical margin for a cell with the half-selected condition is limited to $+/-33\%$ since the cell has to discriminate between one and two units of current. In reality, the margin is even smaller because the Josephson memory gates are usually biased at about half of their electrical currents to enlarge the input operating window, and the dynamics of gates at low biased currents is not well controlled.

P. Wolf invented a basic Josephson cell which eliminates inherent set-up cycle problems of such cells and the difficulties associated with diagonal decoding of these memory cells, obtaining improvements in memory density. The basic Wolf cell operates by establishing or interrupting a circulating current in a superconducting storage loop to represent stored binary information, e.g. a binary "1" or "0". See P. Wolf, "Two-Junction Josephson Memory," IBM Technical Disclosure Bulletin, Volume 26, page 214, Jun. 1973.

W. H. Henkel and J. H. Greiner describe in their paper entitled "Experimental Flux Quantum NDRO Josephson Memory Cell," IEEE J. Solid-State Circuits, Volume SC-14, pages 794-796, 1979, a nondestructive readout (NDRO) memory with two gates, one for the write operation and one for sensing the data. To improve the reliability of the memory and the margins on the write signals, S. M. Faris teaches, in U.S. Pat. No. 4,151,605 (which issued in Apr. 1979), to use a buffer gate in front of the write gate to eliminate the aforementioned half-select problem. This increases the gate count per cell to three but enables a slightly smaller area per each memory cell. However, Faris' cell still has the half-select problem for the sense line. A fully buffered cell of the type described in the aforementioned article by Henkel et al. would require four gates per cell, namely an additional AND gate to buffer the sense gate.

The pressing quest to provide ever faster memories of high density, low power, using a minimal number of gates per cell and free of the half-select and similar problems has not been met by the prior art.

SUMMARY OF THE INVENTION

Accordingly, it is an object of the present invention to provide a buffered nondestructive readout Josephson memory cell with buffered write and sense gates, using only three gates.

It is a further object of the present invention to provide a memory of the aforementioned type which is accessed and organized as a word memory.

It is also an object of the present invention to provide a memory of the aforementioned type which is organized as a bit-mapped memory.

It is still a further object of the present invention to provide a Josephson memory cell which is free of the half-select problem.

The foregoing and other objects of the invention are realized by a memory which is comprised of a plurality of memory cells each of which consists of only three gates and four (read, write, data and sense) control lines. Essentially, each memory cell comprises a first gate, for example a two-junction interferometer, or a SQUID (superconducting QUANTUM interference device) that forms together with at least one inductor a storage loop in which the aforementioned superconducting circulating current is selectively stored.

A second gate, preferably also a symmetric two-junction SQUID, and a second inductor form a second loop which serves to sense the presence or absence of the circulating current in the first loop as will be understood later on. The third gate is connected to the sense line and is coupled to the second inductor of the second loop.

The four access lines of the cell include a write line which is coupled to the first gate, a data line which is connected to the first storage loop, a read line which is connected to the second loop and a sense line which as noted before is coupled to the third gate.

A word memory can be formed by organizing a plurality of such cells into discrete "words". With this organization, the half-select problem is avoided. For write operations, an entire word is selected at a time and the circulating current is either established or interrupted on the basis of the state of the data line of the particular cell. During read operations, a half-select current is injected into the second loop via the read line and a current pulse is either established or not established in the second loop based on the presence or absence of the circulating current in the first loop.

The inductor of the second loop is in turn coupled with the third gate, which gate also receives a half-current pulse from the sense line. Thereby, depending on whether a current is present in the second loop, the third gate is caused, in well-known manner, to switch from one voltage state to another, the output voltage indicating whether a "1" or a "0" is stored in the Josephson cell (the first loop). This cell configuration completely isolates the read signals from the storage cell (loop) proper, completely avoiding the half-select problem.

In accordance with one modification of the invention, the data line also serves as the sense line and the same data line serves for both write and read.

For realizing a bit-accessible memory, the aforementioned basic cell is modified to the extent that the third gate has connected with it in closed circuit relationship a third inductor which is coupled with the first gate, providing a third current loop. The write line is coupled with the third gate, rather than with the first. In this manner, the write line controls the third gate and thereby indirectly the third loop, providing isolation for the write operation and avoiding the half-select problem entirely while still using only three gates.

Other features and advantages of the present invention will become apparent from the following description of the invention which refers to the accompanying drawings.

Figure 5A:
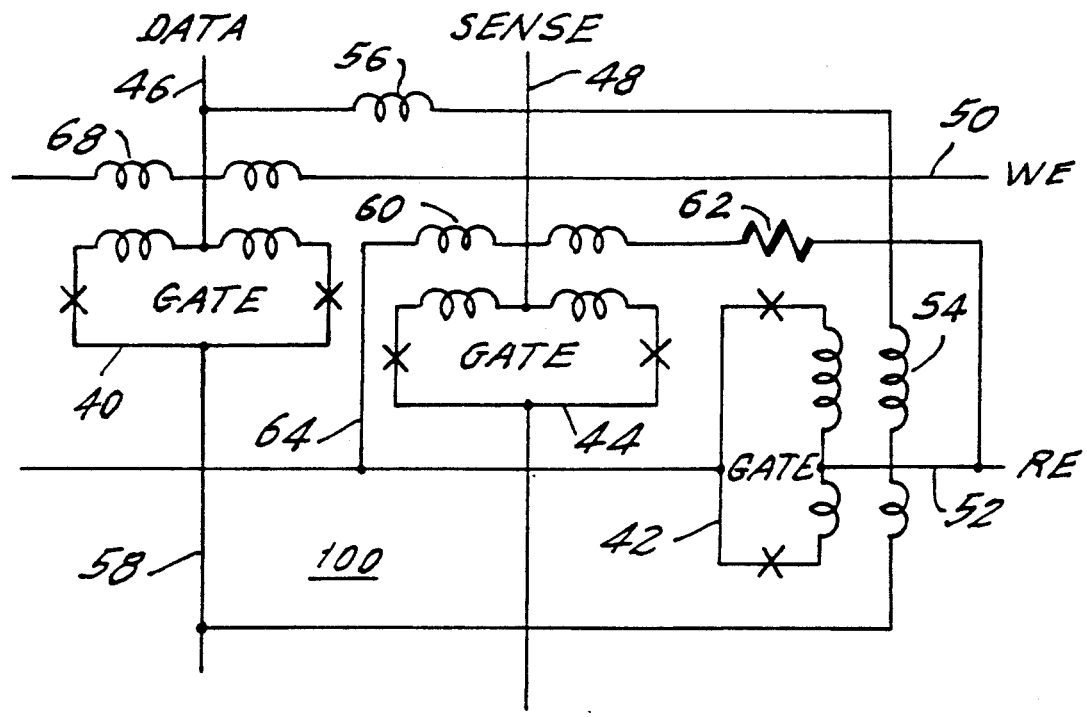
FIG. 5a is an electrical circuit representation of a superconductive memory cell in accordance with a first embodiment of the present invention.

FIG. b is a timing diagram for the access lines of the FIG. 5a memory cell.

FIG. 6 is an electrical circuit diagram of a simplified version of a word-access nondestructive readout memory cell in accordance with a variant of the first embodiment of the present invention.

Figure 7A:
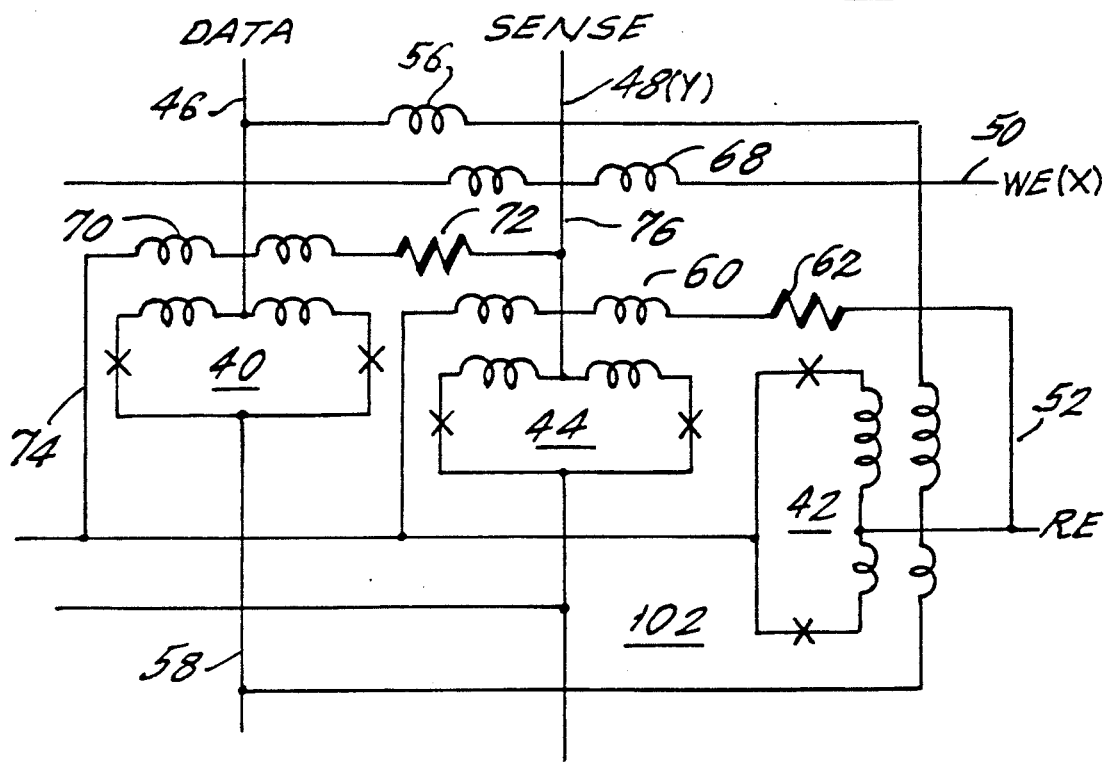

FIG. 7a is an electrical circuit diagram of a memory circuit in accordance with a second embodiment of the present invention, which memory cell is suited for a bit-access memory.

Figure 7B:
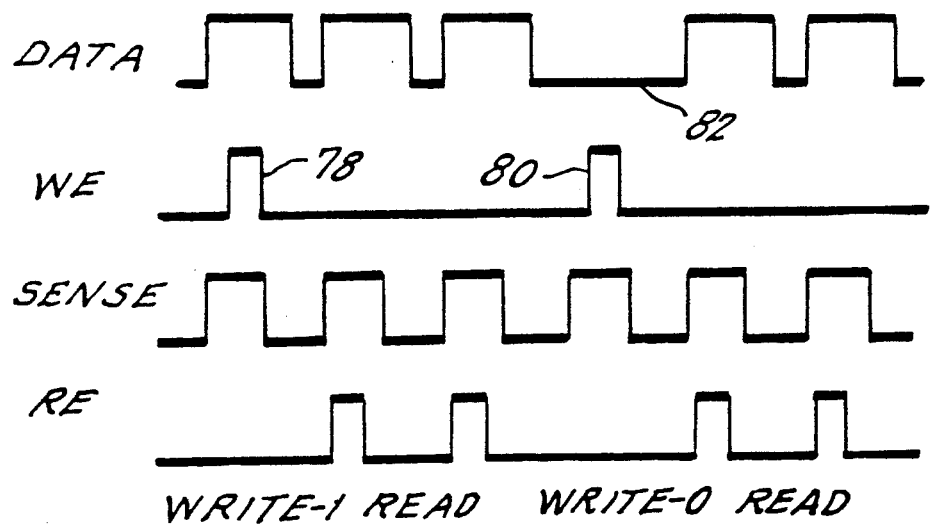

FIG. 7b is a timing diagram for the access lines of the FIG. 7a memory cell.

FIG. 7b is a timing diagram for the access liens of the FIG. 7a memory cell.

Figure 8A:
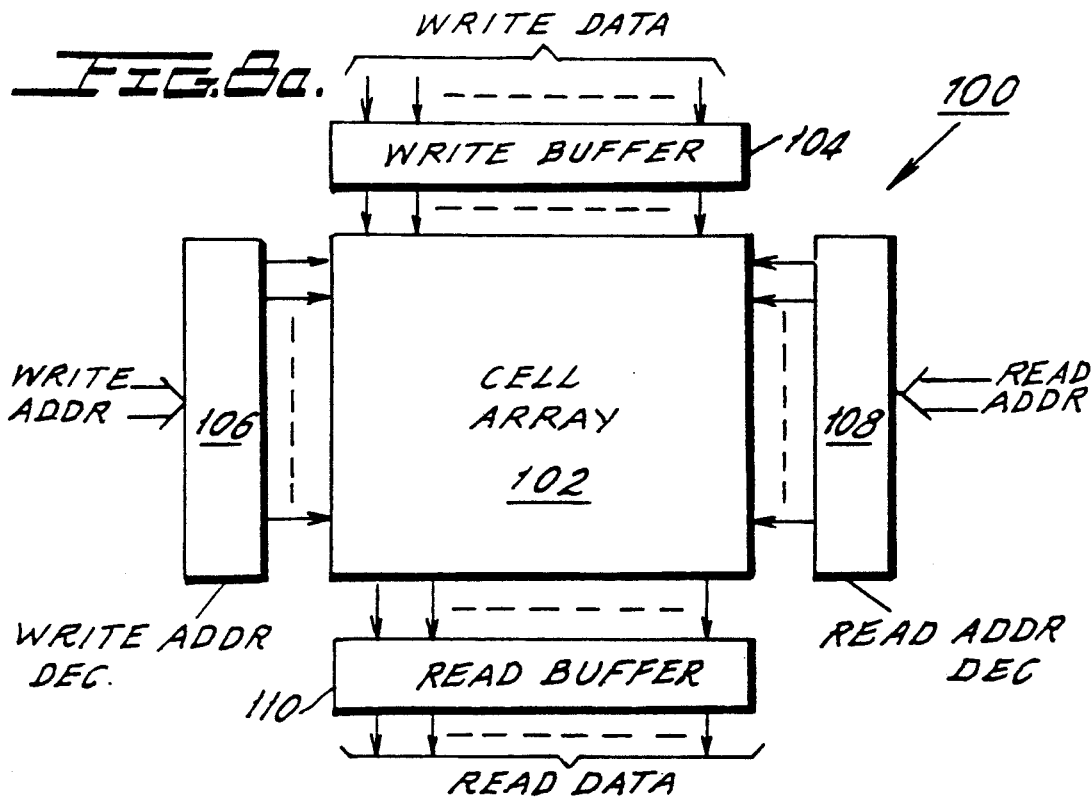

FIG. 8a is a block diagram of a memory cell array.

Figure 8B:
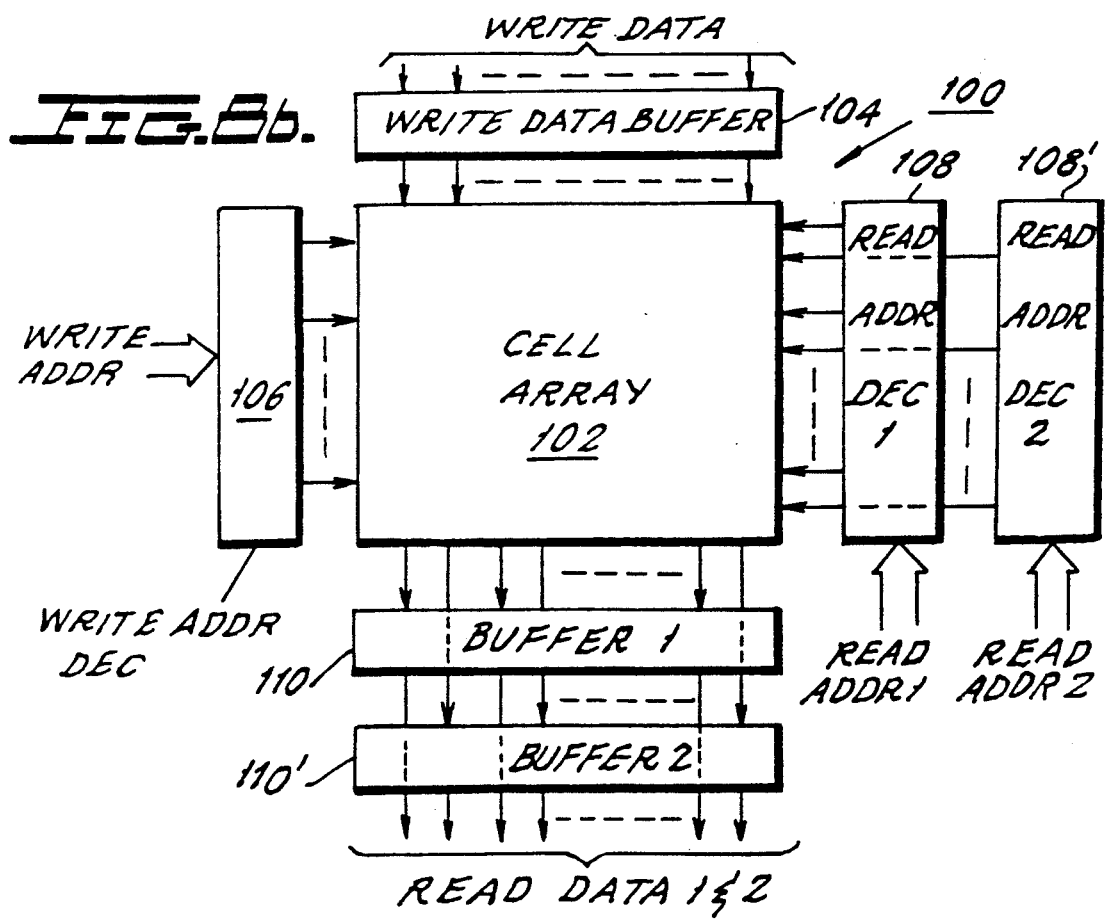

FIG. 8b is a block diagram of a cell array similar to the cell array of FIG. 8a but including an additional read address decoder and an additional data out buffer.

FIG. 8c is a block diagram of a memory system with a pair of cell arrays sharing a single write address decoder and write data lines.

DETAILED DESCRIPTION OF THE DRAWINGS

Figure 1:
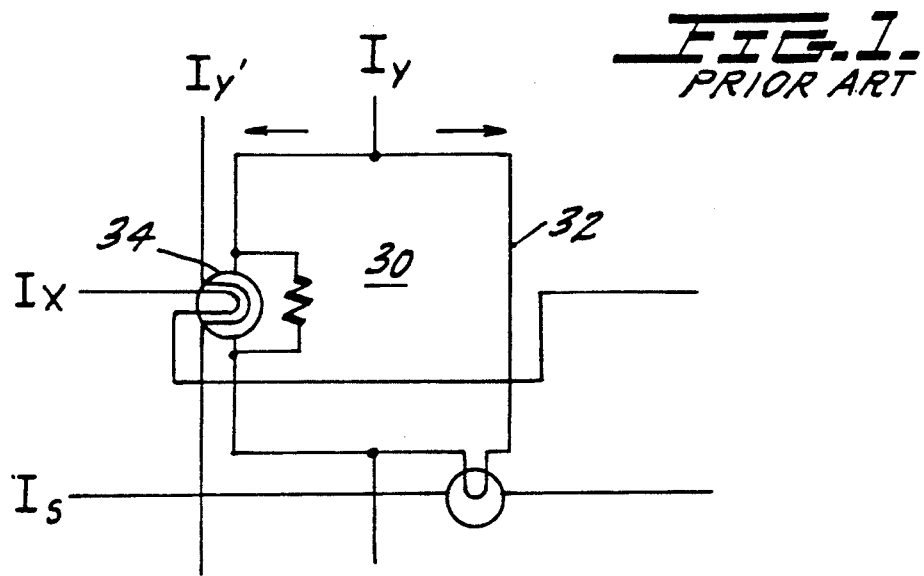
FIG. 1 depicts a basic two-gate nondestructive-readout Wolf cell in accordance with the prior art.

Referring to the drawings, the basic prior art Wolf cell 30 comprises, as shown in FIG. 1, a loop 32 formed of a superconductive wire and a gate 34 in the form of an interferometer or the like which can be controlled to switch between two states. As is well known, by means of the lines $I_x$ and $I_y'$, the gate 34 can be controlled to store or remove from the loop 32 a circulating current which designates either a logic 1 a logic 0. The memory contents of the cell 30 can be read out by activating the sense line $I_s$ simultaneously with the select line $I_y$.

Figure 2:
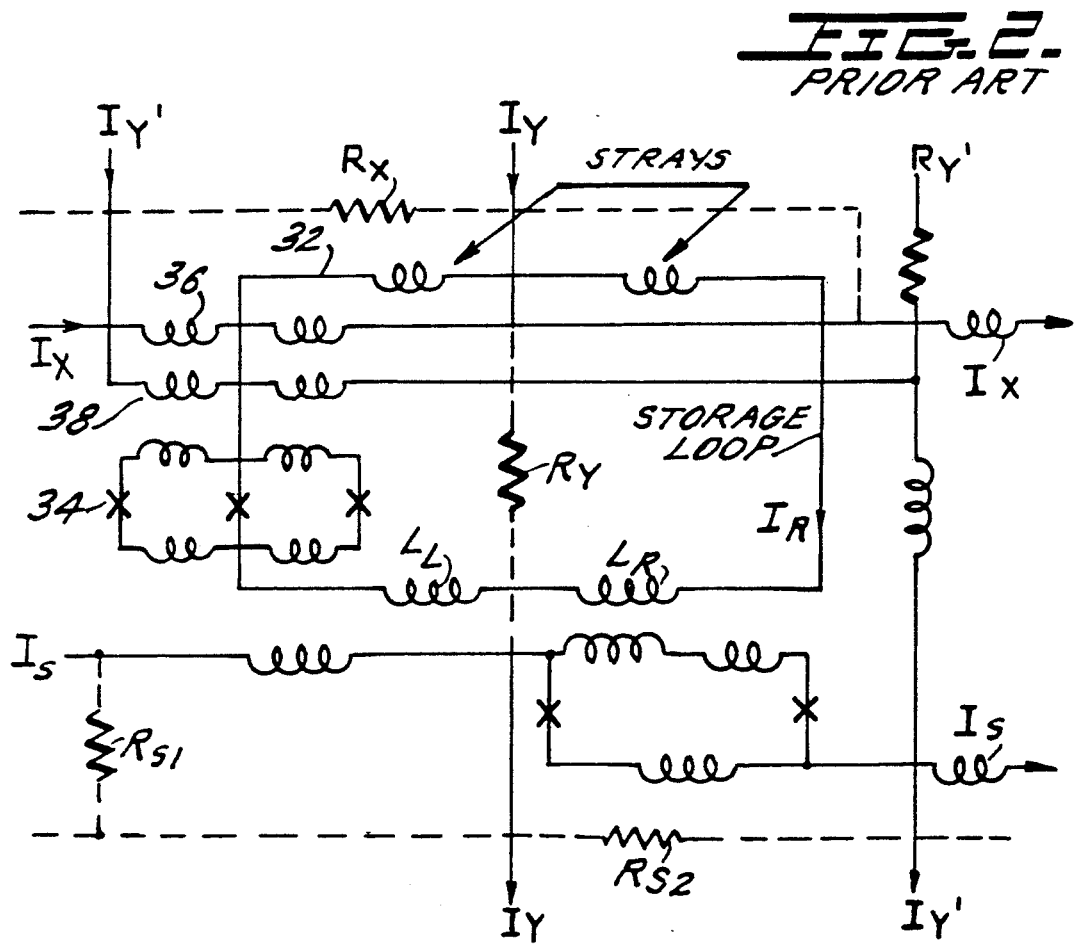
FIG. 2 is an electrical circuit representation of the prior art memory cell of FIG. 1.

The memory cell 30 of FIG. 1 is typically modeled by the electrical circuit of FIG. 2. The gate 34 in this instance is illustrated as a three-junction interferometer to which first and second $I_x$ and $I_y'$ select lines, are electromagnetically coupled. Writing a "1" in a selected cell is accomplished by simultaneous activation of the $I_y'$, $I_x$, and $I_y$, lines while writing a "0" is accomplished by coincidentally activating the $I_x$ and $I_y'$ lines. Reading is accomplished by supplying $I_y$ and a sense current $I_s$ through the $I_s$ select line.

Figure 3:
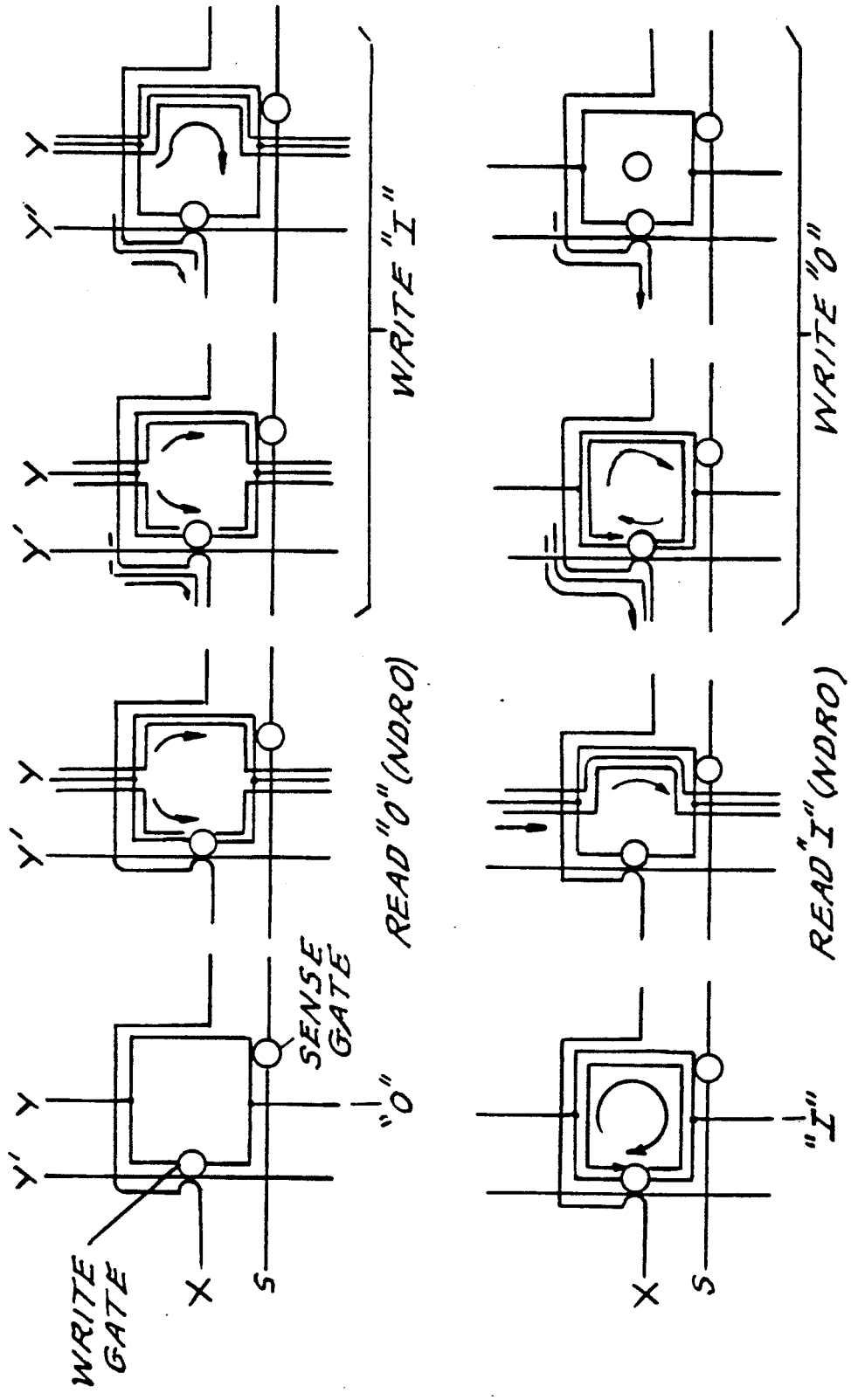
FIG. 3 is a conceptual illustration which aids in the understanding of the read and write operating principles of the Wolf cell of FIGS. 1 and 2.

The manner in which the prior art Josephson memory cell 30 is controlled for writing and reading operations is schematically illustrated in FIG. 3, in a self-explanatory manner.

However, as noted in U.S. Pat. No. 4,151,605 (the contents of which are incorporated by reference herein), a memory constructed in accordance with the basic configuration of FIGS. 1-3 is prone to the half-select problem. That is so because numerous nonselected memory cells still receive a one-half unit of current, both during read and write operations. Under such circumstances because of poor margins and variations in the characteristics of individual cells, information can be written spuriously into unselected memory cells.

Figure 4:
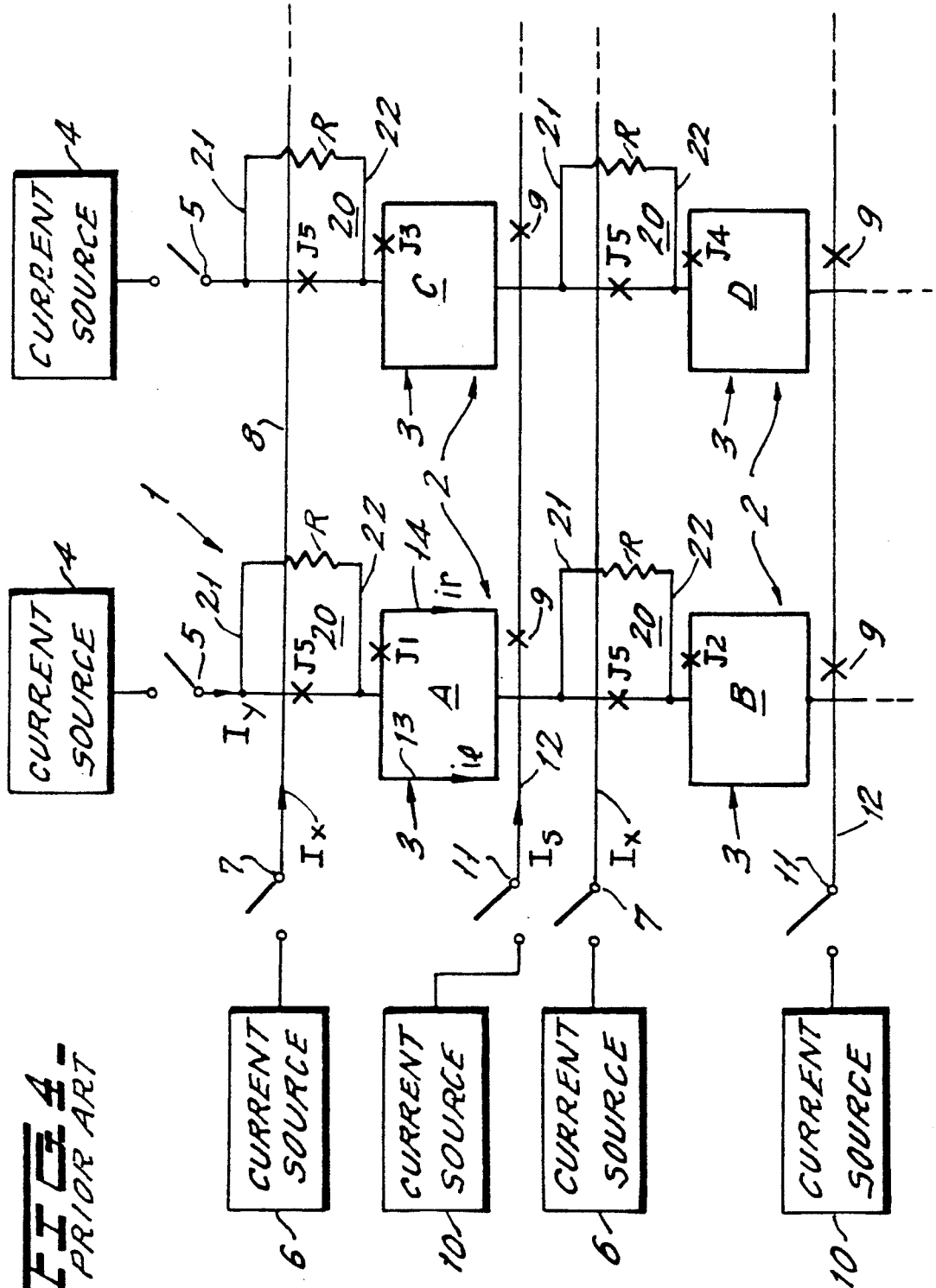
FIG. 4 is a schematic diagram of a portion of a prior superconducting memory employing buffer gates which assure that only a selected memory cell of an array encounters a control magnetic field to avoid the half-select problem.

The foregoing problem is overcome in the U.S. Pat. No. 4,151,605, as shown in FIG. 4 herein, by coupling the $I_x$ line to the individual memory cells A, B, C, D, indirectly through buffer gates 20. In FIG. 4, current sources 4 provide enabling or gate current $I_y$ to columns of the memory cells A, B, C, D via switches 5, current sources 6 provide control currents $I_x$ to rows of the memory cells 20 via switches 7 and current sources 10 provide current pulses to lines $I_s$ to gates 9 for reading operations. Stored circulating current which may be clockwise or counterclockwise represents binary digits 1 and 0 respectively. Without the buffer gate 20, as is well known, a problem of spurious writing exists during a writing or storing operation in any of the memory cells A, B, C, D which encounters simultaneously a control current $I_x$ while already storing information in the form of a clockwise or counterclockwise circulating current.

However, that problem is overcome by the circuit of FIG. 4 in that the control current $I_x$ is applied to the individual memory cells through the buffer gates 20, which applies a control magnetic field only to the selected one of the memory cells A, B, etc. To this end, the buffer 20 includes a switchable device J5 disposed in series with each of the memory cells A, B, C, D. Each of these switchable devices J5 is shunted by a current path 21 which includes a terminating resistance R and a portion 22 effective to cause a switchable device J1 in the cells A, B, C, D to latch or self-reset, in a manner well-known to those skilled in the Josephson art.

Storing information into each cell is achieved by applying currents $I_y$ and $I_x$ simultaneously to activate only a single memory cell. In FIG. 4, only those of the gates 20 which simultaneously see both the $I_x$ and $I_y$ current pulses would have a current flowing in the portion 22 thereof, which portion is magnetically coupled with the switching device J1 in the individual memory cell.

Accordingly, regardless of what is stored in any given memory cell A, B, C, D, no control magnetic field is applied to a memory cell, except to the one cell intended to be selected. In this manner, the half-select problem is avoided. Nonetheless, the circuit of FIG. 4 has the drawback that the half-select problem is still present for the sense line which remains unbuffered. The foregoing drawback is, however, avoided through the use of memory cells in accordance with FIGS. 5-7 herein, which use only three gates while entirely avoiding the half-select problem.

Referring first to FIG. 5a, a NDRO (nondestructive-readout) word memory cell 100 consists of three gates 40, 42 and 44 and four access lines including a data line 46, a sense line 48, a write line 50, and a read line 52.

In the embodiment of FIG. 5a, the first gate 40 is connected in closed circuit relationship with a first inductor 54 and a second inductor 56, defining a storage loop 58 in which a sustained superconductive circulating current can be selectively established to designate digital data corresponding to "1" and "0". The write line 50 has an inductor 68 which is located so that it is magnetically coupled with the first gate 40 as shown.

Figure 5B:
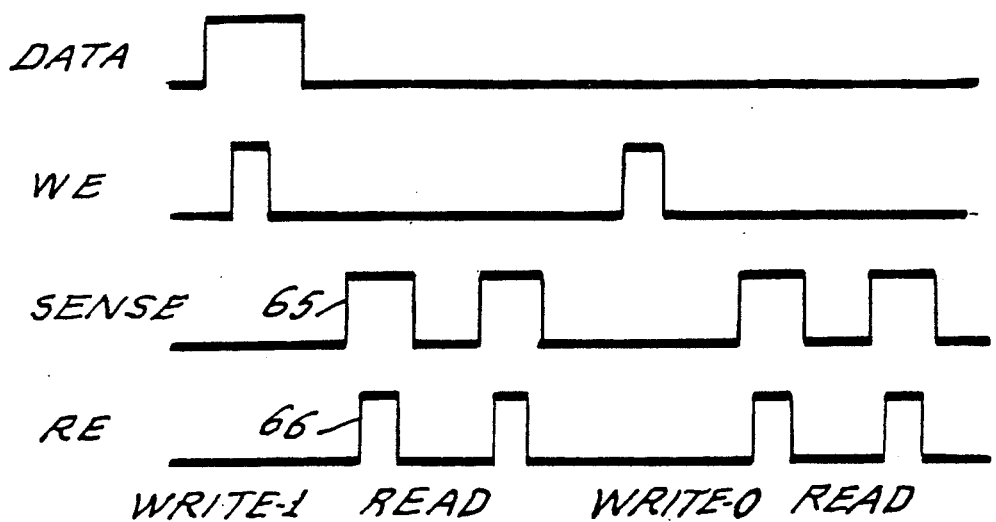

Referring to FIGS. 5a and 5b, a write operation is performed by first injecting a current pulse into the data line 46 if a "1" is to be written into the memory cell 100. A further pulse of current (of narrower width than the data pulse) is simultaneously applied to the write line 50 to select the write gate 40. Note that the write pulse vanishes before the data line pulse drops, as shown in FIG. 5b. A circulating current representing the data "1" is then stored in the superconducting data storage loop 58 which includes the gate 40 and the inductors 56 and 54. The operation for writing a "0" is similar except that the data line 46 is not activated whereby no circulating current is stored in the loop 58 and any prior current in the loop 58 is quenched.

A plurality of the cells shown in FIG. 5a are laid out on a substrate with their access lines 46-52 interconnected to one another to generate a word memory, similar but not identical to a row of cells in FIG. 4. Since all of the individual cells 100 of a single word are simultaneously selected, there is no need for an additional Y-select line and therefore there is no half-select problem for the write operation.

For reading the contents of the storage loop 100, the cell 100 includes the second gate 42 which is disposed so that it is electromagnetically coupled with the inductor 54 of the first loop 58. The second gate 42 has also connected in closed circuit relationship therewith a further inductor 60 and a resistor 62, defining a second loop 64. The read line 52 is connected to this second loop. Note also that the inductor 60 of the second loop 64 is electromagnetically coupled to the third gate 44 to which the sense line 48 is coupled.

To read the contents of the memory cell 100, a current pulse is first injected into the sense line 48 (See the pulse 65 in FIG. 5b) and thereafter another pulse of current (66 in FIG. 5b) is applied to the read line 52. If a circulating current is stored in the storage loop 58 containing the inductor 54 (which inductor 54 is also the control line for the second gate 42), the second gate 42 will switch and steer current into the second loop 64 which contains the small resistor 62. This current flowing through the resistor 62 and inductor 60 causes the sense gate 44 to switch from a superconducting to a voltage state in a manner familiar to those skilled in the Josephson junction art. A data output can then be read on the sense line 48, either as a current or voltage at the top of the line 48. On the other hand, no output will show on the sense line 48 if the circulating current is not flowing through the second inductor 54. The introduction of the buffer gate 42 eliminates the half-select problem during read operations.

Preferably, in the embodiment of FIG. 5a each of the gates 40, 42 and 44 is a two-junction interferometer (SQUID). In-line junction or three-junction interferometers can also be used for the gates. Unipolar currents are used for all the access signals.

It is further preferred that the gates 40 and 44 be symmetric two-junction SQUIDS with mutual inductance of about 4 pH and a critical current of about 0.4 mA. The second gate 42 is preferably an asymmetric SQUID with a 1:3 junction ratio having a total critical current of about 0.4 mA and a mutual inductance of about 4 pH. The sum of the inductances 54 and 56 is preferably about 20 pH to store 3 flux quanta. The resistor 62 is on the order of 0.1 ohms.

It is noted here that in the arrangement of FIG. 5a, the write gate 40 and the storage inductance loop 58 are different from the corresponding structure in the cells shown in the prior art FIGS. 1 and 2. In the prior art figures, the storage loop of any given memory cell is divided into left and write branches and each contains approximately equal inductances. In contrast, in the present invention the inductance in the left branch which includes the write gate 40 is minimized and the inductance in the right branch is maximized.

The use of different lines for write and read has the advantage of permitting simultaneous write and read. That is, when a given row is subjected to a write operation another row can perform the read operation by driving its own read enable line 52 without affecting the memory word on which a write operation is performed.

FIG. 6 is generally similar to FIG. 5a and differs from it in that the data and sense lines are combined in a single line 46/50. In this embodiment, the sense gate 44 is connected in series with the first gate 40, within the storage loop 58.

FIG. 7a depicts an NDRO memory cell 102 with only three gates 40, 42, and 44, and still bit-accessible and buffered in both its write and sense lines. FIG. 7a differs from FIG. 5a in that the inductance 68 associated with the write line 50 is electromagnetically coupled to the third gate 44 and in the inclusion of a further inductance 70 and a series connected resistor 72. These elements 70 and 72 are connected in closed circuit relationship with the third gate 44, forming a third loop 74 to which the sense line 48 is connected at the junction 76 of the gate 44 and the resistor 72.

The signal waveforms for the memory cell 102 of FIG. 7a are shown in FIG. 7b.

In operation, the write gate 40 is triggered by the output of the third buffer gate 44 which serves to send a pulse of current through the third loop 74 including the inductor 70 that is coupled to the write gate 40. The gate 44 serves as a buffer gate controlled by the write line 50 during the write operation and as a sense gate controlled by the output of the gate 42 during read operations. During a read operation, the second gate 42 senses the storage current in the first loop 58 and is the buffer between the read signals and the storage gate 40, identically as described relative to the word memory cell of FIG. 5a.

For a write operation, the write line 50 (which corresponds to the X-select line of the prior art figures) and the sense line 48 (Y-select) are driven to switch the buffer gate 44, sending a current pulse through the third loop 74 and therefore through the inductor 70, which corresponds to sending a write pulse through the inductor 68 in FIG. 5a. In response, the first storage gate 40 then assumes a state which either switches on or stops current to the storage inductance loop 58, depending on whether the data line 46 has been pulsed to store a "1" or not pulsed to store a "0". With reference to FIG. 7b, the first write (WE) pulse 78 will cause a circulating current or a "1" to be established in the first loop 58, whereas the second write pulse 80 will store a "0" in the loop because the data line has dropped to "0" at reference numeral 82.

The read operation is performed by simultaneously activating the read line 52, sense line 48 and data line 46 as shown by the waveforms of FIG. 7b. Consequently, in the same manner as with FIG. 5a, the sense line 48 will have impressed on it a voltage state if a "1" has been written into the memory cell 102 and a superconducting state with no voltage if a "0" has been stored. Note that it is necessary to drive the data line (set the same to "1") every time during a read operation to protect the circulating current That is because, if a "1" has been stored in the storage loop 58, a pulse of current will automatically flow in the inductance 70, as in a write operation. If the data line 46 were not to be set to "1", the contents of the storage loop would invariably become erased. By setting the data line 46 to "1", the circulating current is maintained. If a "0" has been stored, a current pulse will not develop in the third loop 74 and a write pulse will not be applied to the gate 40, leaving the stored "0" data undisturbed, despite the pulsing of the data line.

Note that the use of double control lines for the third gate 44 fully solves the half-select problem but does result in a larger cell size, as compared to the cell size of the word memory of FIG. 5a.

Preferably the circuit elements in FIG. 7a are identical to those in FIG. 5a except for the additional resistor 62 which is preferably a 5 ohm resistor. It is to be understood that the resistors 62 and 72 serve to dissipate and stop the circulating currents that are established in the loops 52 and 74 during read operations.

The "word" organized NDRO memory of FIG. 5a was reduced to practice as a 2×2 matrix using a standard Nb process with minimum line width of 2.5 $\mu$m and a minimum junction size of 3.75 $\mu$m at a current density of 800 A/cm$^2$. The cell size was 50 $\mu$m×52 $\mu$m. The first and third gates 40 and 44 were fabricated as symmetric SQUIDS whereas the second gate 42 was fabricated as an asymmetric SQUID. The first and third SQUIDS were identically laid out and had 0.32 mA critical current and 2.24 pH mutual inductance for the SQUID loop. The second gate 42 was a 1:3 asymmetric SQUID with a total inductance of 2.24 pH and a critical current of 0.35 milliamps. The small resistor 62 in parallel with the second gate 42 had a resistance of 0.4 ohm. The write line 50 was made of 0.6 um thick Nb wire having widths of 2.5 $\mu$m on top of the SQUID loop of the first gate 40 and 5 $\mu$m across steps. Measured critical current of the write line 50 was 9.5 milliamps.

Three chips of the aforementioned construction were fabricated and tested. Their measured margins for the data, sense, and read lines were $+/-27\%$, $+/-48\%$ and $+/-17\%$, respectively, when other signals were held at nominal values. The read line had a smaller margin which is partly due to a 20% reduction of the current density compared to the target value of 1000 A/cm$^2$ and a smaller mutual inductance than designed. The write line had a lower limit of 0.42 milliamps and upper limit of 9.5 milliamps before the wire went normal.

The memory cells heretofore described may be organized in a manner well-known to those skilled in the art into cell arrays. Referring to FIG. 8a, a bit or word accessible memory 100 comprises a cell array 102 to which write data is coupled via a write buffer 104 for being written into the cell array 102, into locations thereof defined by a write address that is converted to row and column select lines by means of a write address decoder 106. The contents of the cell array 102 may be read by inputting read addresses via the read address decoder 108. Data appears at the output of a read buffer 110.

The embodiment of FIG. 8a is similar in all respects to that of FIG. 8a with the exception that an additional read address decoder 108' is added to receive a second read address, enabling the contents of two memory locations to be accessed simultaneously. The contents of the second selected memory location are made available at a second read buffer 110'. This embodiment enables, for example, two microprocessors (not shown) to simultaneously access the cell array 102.

In the embodiment of FIG. 8c, a memory 120 comprises a first cell array 122 and a second cell array 122'. The first cell array 122 has associated with it a write buffer 124, a read address decoder 126 and a read buffer 130. The second cell array 122' has associated with it a write buffer 124', a read address decoder 126' and a read buffer 130'. The cell arrays 122 and 122' share a single write address decoder 128 and have the same inputs into their write buffers. This embodiment enables data to be simultaneously written into identical locations of the first and second cell arrays 122 and 122'. The embodiment permits simultaneous as well as totally independent reading of the contents of the pair of cell arrays 122 and 122'.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A Josephson memory comprising at least one Josephson memory cell, each memory cell including:
    three gates including a first, a second and a third gate;
        a first inductor connected in closed circuit relationship with the first gate and defining therewith a first circuit loop effective for the selective storage therein of a sustained circulating current;
    a data line operatively connected to the first loop;
    a write line effective with the data line for selectively establishing or quenching the circulating current in the first loop;
    a second loop comprising the second gate and a second inductor, the second inductor being coupled to the third gate;
    a read line operatively connected to the second loop; and
    a sense line operatively connected to the third gate, the third gate being configured to change from a first electrical state to a second electrical state and vice versa, upon actuation of the sense line and based upon the presence or absence of the circulating current in the first loop.

2. The Josephson memory of claim 1, the write line including a write line inductor electromagnetically coupled to the first gate.

3. The Josephson memory of claim 2, wherein the memory comprises no other gates except for the first, second and third gates.

4. The Josephson memory of claim 3, wherein each said gate is an interferometer.

5. The Josephson memory of claim 4, wherein each said gate is a two-junction interferometer.

6. The Josephson memory of claim 5, wherein each said first and third gate is a symmetric two-junction SQUID.

7. The Josephson memory of claim 5, wherein each said first and third gate has a mutual induction of about 4 pH.

8. The Josephson memory of claim 5, wherein each said first and third gate has a critical current of about 0.4 milliamps.

9. The Josephson memory of claim 3, wherein the second gate is an asymmetric SQUID.

10. The Josephson memory of claim 9, wherein the asymmetric SQUID has about a 1:3 junction ratio.

11. The Josephson memory of claim 9, wherein the second gate has a mutual inductance of about 4 pH and a critical current of about 0.4 milliamps.

12. The Josephson memory of claim 3, wherein the first loop includes a third inductor, the memory having associated with it a flux quanta of predetermined value, the combined inductance of the first and the third inductances being sufficient to store at least about three flux quanta.

13. The Josephson memory of claim 3, further comprising a resistor disposed in series in the second loop.

14. The Josephson memory of claim 13, wherein the resistor has a resistance value on an order of magnitude of about 0.1 ohm.

15. The Josephson memory of claim 3, wherein the third gate is connected in series with the first gate and in the first loop.

16. The Josephson memory of claim 3, including a plurality of the memory cells, defining a memory word.

17. A Josephson memory including at least one Josephson memory cell, the memory cell comprising:
a first, a second and a third gate;
first, second and a third inductors, the first inductor connected in closed circuit relationship with the first gate and defining a first storage loop, the second inductor connected in closed circuit relationship with the second gate and defining a second loop, the third inductor connected in closed circuit relationship with the third gate in defining a third
the first gate being operatively coupled with the third inductor, the second gate being operatively coupled with the first inductor and the third gate being operatively coupled with the second inductor; and
a write line operatively coupled with the third gate, a data line operatively connected to the first loop, a sense line operatively connected to the third loop and a read line operatively connected with the second loop.

18. The Josephson memory of claim 17, wherein the coupling between the first gate and the third inductor, the second gate and the first inductor and the third gate and the second inductor is electromagnetic.

19. The Josephson memory of claim 18, further comprising a resistor connected in series in the third loop.

20. The Josephson memory of claim 17, wherein each of the gates comprises an interferometer.

21. The Josephson memory of claim 17, further comprising a plurality of the memory cells, the memory cells commonly sharing the data line, the sense line, the read line and the write line and defining a bit-accessible NDRO memory.

22. The Josephson memory of claim 1, comprising a plurality of said Josephson memory cells arranged in an array, the array having connected thereto a write buffer for write data, a read data decoder for a read address, a write address decoder for a write address, and a read buffer for output data.

23. The Josephson memory of claim 22, further comprising a second read address decoder for a second read address and a second read buffer for second output data.

24. The Josephson memory of claim 17, comprising a plurality of said Josephson memory cells arranged in an array, the array having connected thereto a write buffer for write data, a read data decoder for a read address, a write address decoder for a write address, and a read buffer for output data.

25. The Josephson memory of claim 24, further comprising a second read address decoder for a second read address and a second read buffer for second output data.

26. The Josephson memory of claim 1, comprising a plurality of the Josephson memory cells and configured into first and second cell arrays;
the first cell array having connected thereto a first write buffer, a first read address decoder, and a first read buffer;
the second cell array having connected thereto a second write buffer, a second read address decoder, and a second read buffer; and
a write address decoder for a write address connected to both the first and second cell arrays.

27. The Josephson memory of claim 26, including a set of write data lines, the write data lines being connected in common to the first and the second write buffer.

28. The Josephson memory of claim 17, comprising a plurality of the Josephson memory cells and configured into first and second cell arrays;
the first cell array having connected thereto a first write buffer, a first read address decoder, and a first read buffer;
the second cell array having connected thereto a second write buffer, a second read address decoder, and a second read buffer; and
a write address decoder for a write address connected to both the first and second cell arrays.

29. The Josephson memory of claim 28, including a set of write data lines, the write data lines being connected in common to the first and the second write buffer.

* * * * *